US011417737B2

(12) United States Patent
Huang

(10) Patent No.: US 11,417,737 B2
(45) Date of Patent: Aug. 16, 2022

(54) SEMICONDUCTOR STRUCTURE HAVING VERTICAL FIN WITH OXIDIZED SIDEWALL AND METHOD OF MANUFACTURING THE SAME

(71) Applicant: NANYA TECHNOLOGY CORPORATION, New Taipei (TW)

(72) Inventor: Chin-Ling Huang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/934,831

(22) Filed: Jul. 21, 2020

(65) Prior Publication Data

US 2022/0028987 A1 Jan. 27, 2022

(51) Int. Cl.
| | | |
|---|---|---|
| *H01L 29/41* | (2006.01) | |
| *H01L 29/417* | (2006.01) | |
| *H01L 23/525* | (2006.01) | |
| *H01L 29/423* | (2006.01) | |
| *H01L 29/66* | (2006.01) | |

(52) U.S. Cl.
CPC .... *H01L 29/41741* (2013.01); *H01L 23/5256* (2013.01); *H01L 29/4236* (2013.01); *H01L 29/66795* (2013.01)

(58) Field of Classification Search
CPC ........... H01L 29/41741; H01L 23/5256; H01L 29/66795; H01L 29/4236
USPC .......................................................... 257/529
See application file for complete search history.

(56) References Cited

U.S. PATENT DOCUMENTS

| | | | |
|---|---|---|---|
| 9,443,982 B1* | 9/2016 | Balakrishnan | .... H01L 29/66772 |
| 9,640,667 B1* | 5/2017 | Balakrishnan | ........ H01L 29/201 |
| 9,647,112 B1* | 5/2017 | Balakrishnan | ...... H01L 29/7845 |
| 9,647,123 B1* | 5/2017 | Balakrishnan | ...... H01L 27/0924 |
| 9,773,913 B1* | 9/2017 | Balakrishnan | .... H01L 21/28518 |
| 9,780,088 B1* | 10/2017 | Balakrishnan | .... H01L 29/78696 |
| 9,793,401 B1* | 10/2017 | Balakrishnan | .... H01L 29/42392 |
| 9,799,777 B1* | 10/2017 | Balakrishnan | .............................. H01L 21/823487 |
| 10,777,468 B1* | 9/2020 | Zhang | ................. H01L 21/8221 |
| 2017/0345829 A1* | 11/2017 | Balakrishnan | .... H01L 21/76224 |
| 2018/0090504 A1* | 3/2018 | Balakrishnan | .............................. H01L 21/823487 |
| 2018/0122913 A1* | 5/2018 | Xie | ................. H01L 21/823487 |
| 2019/0214309 A1* | 7/2019 | Balakrishnan | ...... H01L 29/8083 |
| 2019/0305111 A1 | 10/2019 | Subramanian et al. | |
| 2019/0312044 A1* | 10/2019 | Balakrishnan | .... H01L 29/66666 |
| 2020/0273755 A1* | 8/2020 | Wu | ................. H01L 21/823487 |

(Continued)

*Primary Examiner* — Mohammad M Hoque
(74) *Attorney, Agent, or Firm* — Muncy, Geissler, Olds & Lowe, P.C.

(57) ABSTRACT

The present disclosure provides a semiconductor structure having a vertical fin with an oxidized sidewall and a method for preparing the semiconductor structure. The semiconductor structure includes a substrate, a top source/drain, a channel fin, a gate structure, a top cathode/anode, and a vertical fin. The substrate has a bottom source/drain and a bottom cathode/anode. The top source/drain is disposed above the bottom source/drain of the substrate, and the channel fin connects the top source/drain to the bottom source/drain of the substrate. The gate structure is disposed on the channel fin. The top cathode/anode is disposed above the bottom cathode/anode of the substrate, and the vertical fin connects the top cathode/anode to the bottom cathode/anode of the substrate, wherein the vertical fin has an oxidized sidewall.

12 Claims, 14 Drawing Sheets

(56) References Cited

U.S. PATENT DOCUMENTS

| | | | | |
|---|---|---|---|---|
| 2020/0312849 A1* | 10/2020 | Cheng | ............... | H01L 29/41791 |
| 2020/0328127 A1* | 10/2020 | Yamashita | ............ | H01L 21/265 |
| 2020/0343241 A1* | 10/2020 | Wu | .................... | H01L 27/0688 |
| 2021/0167129 A1* | 6/2021 | Reznicek | ............ | H01L 45/1683 |
| 2021/0175285 A1* | 6/2021 | Reznicek | .......... | H01L 29/66666 |
| 2021/0193737 A1* | 6/2021 | Reznicek | ................ | H01L 45/04 |

* cited by examiner

SEMICONDUCTOR STRUCTURE HAVING VERTICAL FIN WITH OXIDIZED SIDEWALL AND METHOD OF MANUFACTURING THE SAME

TECHNICAL FIELD

The present disclosure relates to a semiconductor structure and a method for manufacturing the same, and more particularly, to a semiconductor structure having a vertical fin with an oxidized sidewall and a method for manufacturing the same.

DISCUSSION OF THE BACKGROUND

Electrically programmable fuses (e-fuses) allows for the dynamic real-time reprogramming of semiconductor chips. By utilizing a set of e-fuses, it is possible to change the circuits on a chip while it is in operation. The applications of this technology may include memories with redundant circuits to increase manufacturing yield, post-manufacture programming of circuits, preventing downgrading the firmware of a device, and package identification coding. Despite the advantages, e-fuses can consume precious chip space.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY one aspect of the present disclosure provides a semiconductor structure. In one embodiment of the present disclosure, the semiconductor structure comprises a substrate, having a bottom source/drain and a bottom cathode/anode; a top source/drain above the bottom source/drain of the substrate; a channel fin, connecting the top source/drain to the bottom source/drain of the substrate; a gate structure, disposed on the channel fin; a top cathode/anode above the bottom cathode/anode of the substrate; and a vertical fin, connecting the top cathode/anode to the bottom cathode/anode of the substrate, wherein the vertical fin has an oxidized sidewall.

Another aspect of the present disclosure provides another semiconductor structure. In one embodiment of the present disclosure, the semiconductor structure comprises a substrate having a bottom source/drain and a bottom cathode/anode of the substrate; a top source/drain above the bottom source/drain; a channel fin, connecting the top source/drain to the bottom source/drain of the substrate; a gate structure, disposed the channel fin; a top cathode/anode above the bottom cathode/anode of the substrate; and a fuse fin, connecting the top cathode/anode to the bottom cathode/anode of the substrate, wherein the width of the fuse fin is smaller than the width of the channel fin.

Another aspect of the present disclosure provides a method of manufacturing a semiconductor structure. In one embodiment of the present disclosure, the method of manufacturing the semiconductor structure comprises the steps of providing a substrate having a bottom source/drain and a bottom cathode/anode; forming a channel fin on the bottom source/drain of the substrate and a vertical fin on the cathode/anode of the substrate; forming a top source/drain on the channel fin and a top cathode/anode on the vertical fin; forming a gate structure on the channel fin; and forming an oxidized sidewall on the vertical fin.

In the semiconductor structure disclosed in the present disclosure, the vertical fin connecting the top cathode/anode and the bottom cathode/anode is oxidized to create an oxidized sidewall, which can then be removed to reduce the width of the vertical fin. Moreover, the vertical fin may be silicided to form an e-fuse with the top cathode/anode and the bottom cathode/anode. The size of the vertical fin/e-fuse is reduced and precious chip space can be saved, the footprint of the semiconductor structure is thus reduced. Semiconductor chips with lower cost, more functions can therefore be produced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
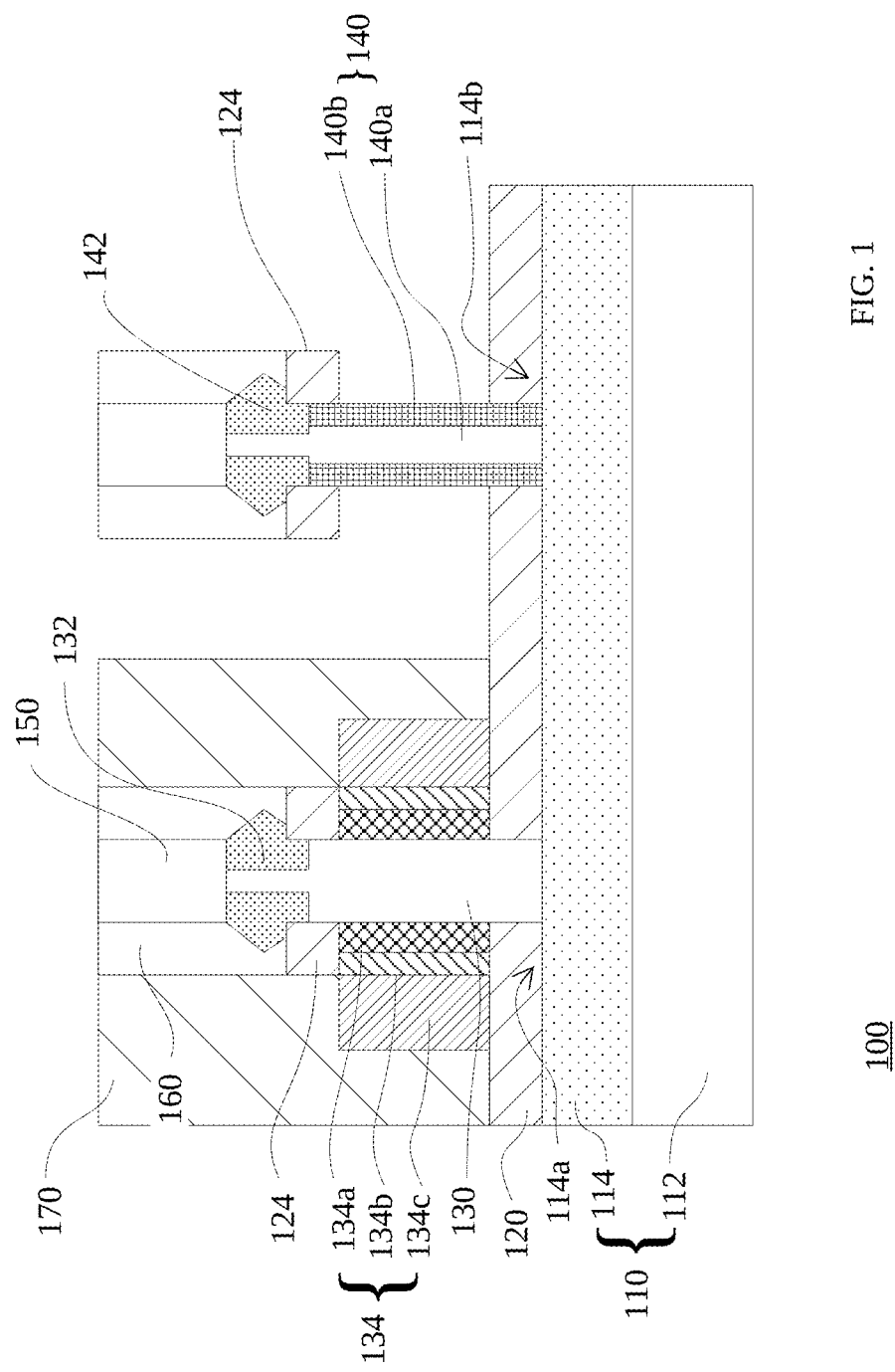
FIG. 1 is a sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a sectional view of a semiconductor structure in accordance with some embodiments of the present disclosure. Please refer to FIG. 1. The semiconductor memory structure provided in the present disclosure includes a substrate 110, a top source/drain, a channel fin 130, a gate structure, a top cathode/anode, and a vertical fin 140. The substrate 110 has a bottom source/drain 114a and a bottom cathode/anode 114b. The top source/drain is disposed above the bottom source/drain 114a of the substrate 110, and the channel fin 130 connects the top source/drain to the bottom source/drain 114a of the substrate 110. The gate structure is disposed on the channel fin 130. The top cathode/anode is disposed above the bottom cathode/anode 114b of the substrate 110, and the vertical fin 140 connects the top cathode/anode to the bottom cathode/anode 114b of the substrate 110, wherein the vertical fin 140 has an oxidized sidewall.

Figure 2:
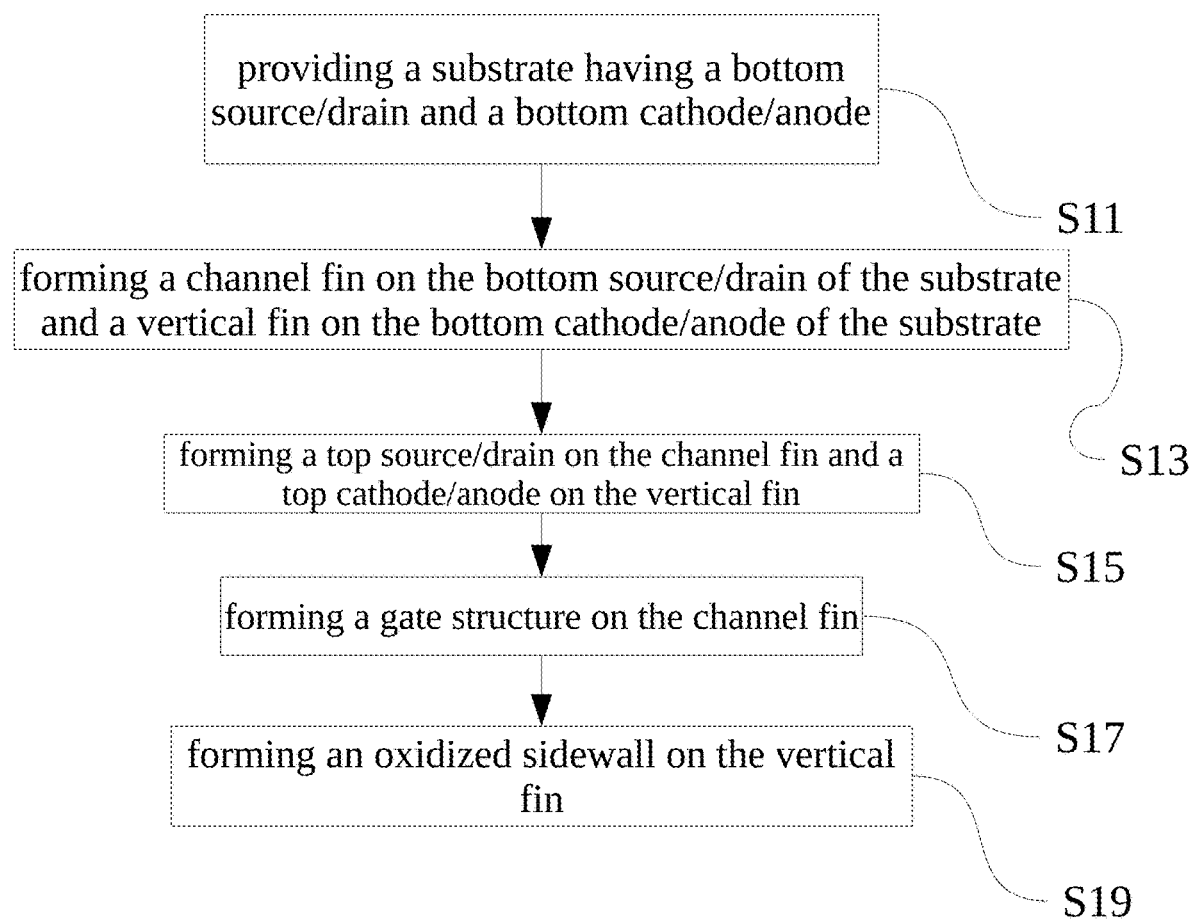
FIG. 2 is a flow diagram of a method of manufacturing a semiconductor structure in accordance with some embodiments of the present disclosure.
Figure 3:
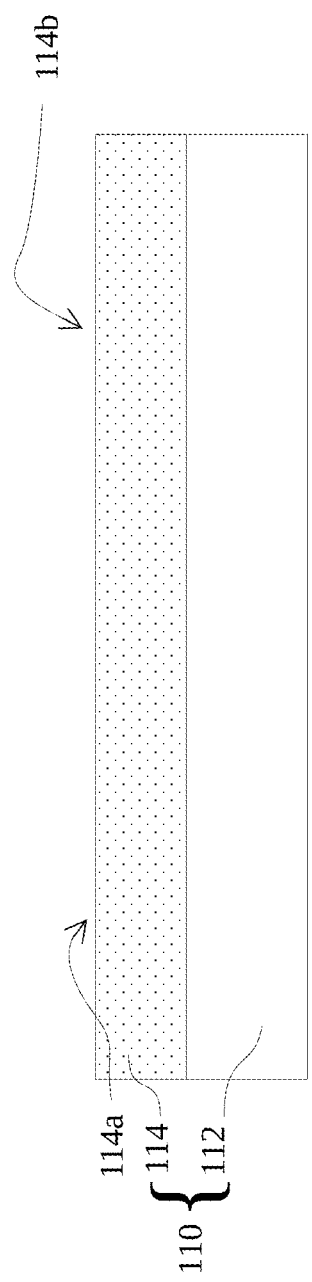
FIG. 3 to FIG. 10, and FIG. 12 are sectional views of the results of the steps of a method of manufacturing a semiconductor structure in accordance with some embodiments of the present disclosure.

The method of manufacturing the semiconductor structure will be explained in detail below along with drawings. FIG. 2 is a flow diagram of a method of manufacturing a semiconductor structure in accordance with some embodiments of the present disclosure, and FIG. 3 to FIG. 10 are sectional views of the results of steps of the method of manufacturing a semiconductor structure in accordance with some embodiments of the present disclosure. Please refer to FIG. 2 and FIG. 3. The method begins with the step S11, which includes providing a substrate 110 with a bottom source/drain 114a and a bottom cathode/anode 114b.

In some embodiments, the substrate 110 may be essentially (i.e., except for contaminants) a single element (e.g., silicon), primarily of a single element (i.e., with doping), for example, silicon (Si) or germanium (Ge), or the substrate 110 may be a compound semiconductor, for example, a III-V compound semiconductor such as gallium arsenide (GaAs), silicon carbide (SiC), or silicon-germanium (SiGe).

In one or more embodiments, the substrate 110 has a base layer 112 and a doped layer 114, and the bottom source/drain 114a and the bottom cathode/anode 114b of the substrate 110 may be formed by forming a doped layer 114 on the substrate 110. The doped layer 114 may be n-doped or p-doped. Part of the doped layer 114 of the substrate 110 forms the bottom source/drain 114a, another part of the doped layer 114 of the substrate 110 forms the bottom cathode/anode 114b. In various embodiments, a counter-doped layer (not shown) may be formed on or within the substrate 110 to electrically isolate the doped layer 114. The counter-doped layer may be n-doped or p-doped. In one or more embodiments, the doped layer 114 may be formed on the counter-doped layer. In various embodiments, dopants may be ion implanted into the counter-doped layer and/or the doped layer 114. The counter-doped layer may include a dopant type opposite to that of the doped layer 114. In some embodiments, the substrate 110 may be a single crystal substrate 110 and the counter-doped layer and the doped layer 114 may each be in-situ doped during epitaxial growth.

Figure 4:
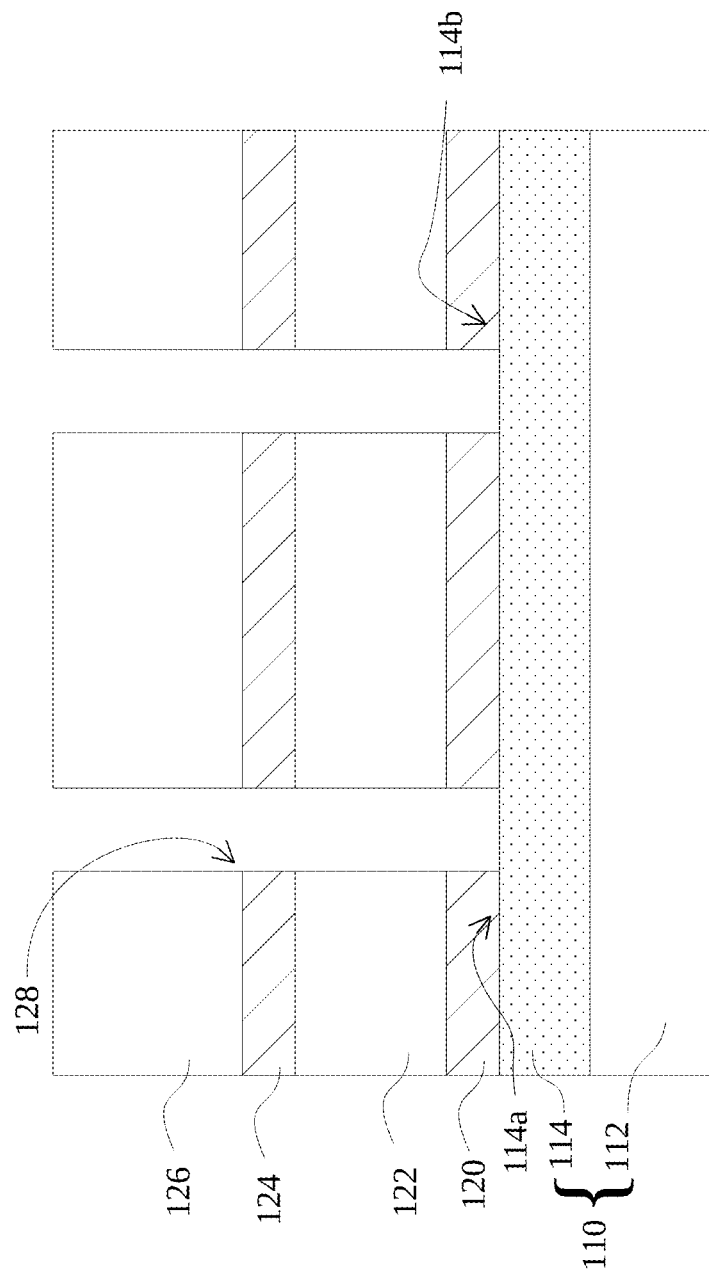
Figure 5:
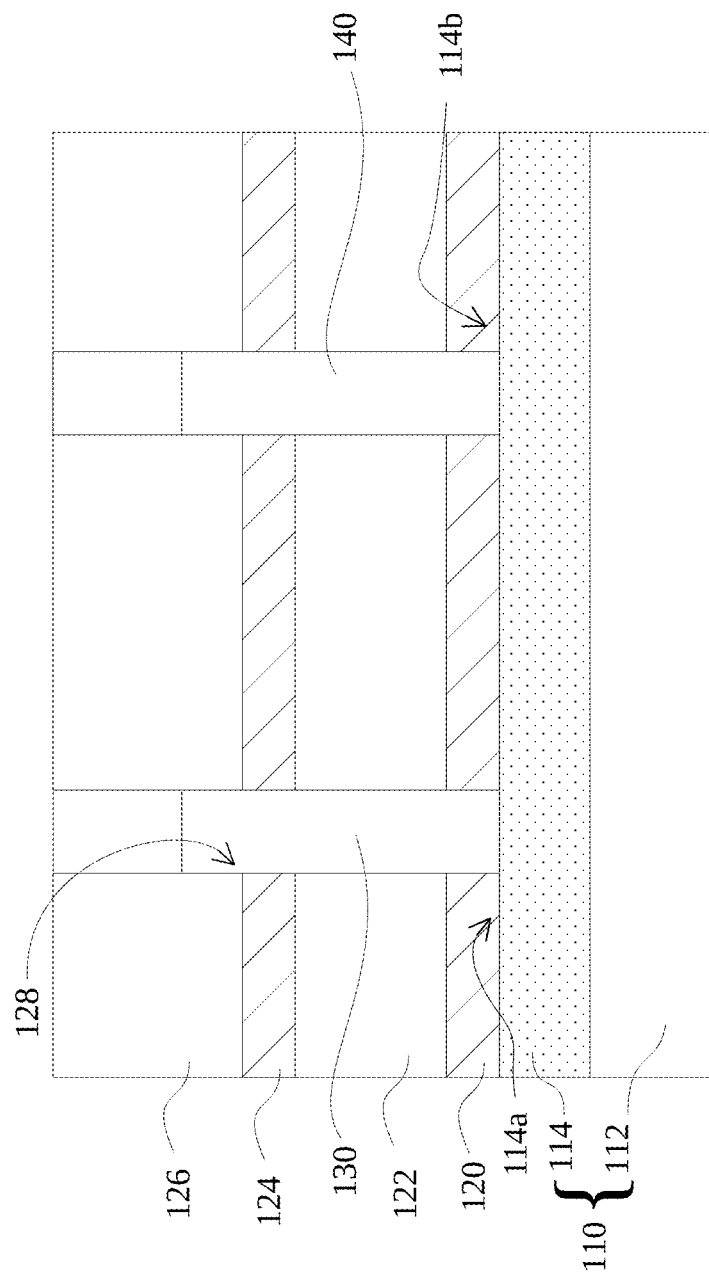

Please refer to FIG. 2, FIG. 4 and FIG. 5. The next step S13 includes forming a channel fin 130 on the bottom source/drain 114a of the substrate 110, and a vertical fin 140 is formed on the bottom cathode/anode 114b of the substrate 110. In some embodiments, the step of forming the channel fin 130 and the vertical fin 140 may include forming a bottom spacer layer 120 on the doped layer 114, forming a first sacrificial layer 122 on the bottom spacer layer 120, forming a top spacer layer 124 on the bottom spacer layer 120, and forming a second sacrificial layer 126 on the top spacer layer 124. In various embodiments, the top spacer layer 124 may be the same material as the bottom spacer layer 120, which may be a dielectric material, such as boron nitride (BN), silicon nitride (SiN), silicon oxide (SiO), or silicon oxynitride (SiON). In one or more embodiments, the second sacrificial layer 126 may be an oxide layer, for example, an oxide layer. In some embodiments, the second sacrificial layer 126 may be a material different from the top spacer layer 124 and the bottom spacer layer 120. In various embodiments, the first sacrificial layer 122 may be polycrystalline silicon (p-Si) or amorphous silicon (a-Si). In some embodiments, the bottom spacer layer 120, the top spacer layer 124, the first sacrificial layer 122 and the second sacrificial layer 126 may be formed with chemical vapor deposition (CVD) or physical vapor deposition (PVD).

In one or more embodiments, the bottom spacer layer 120, the top spacer layer 124, the first sacrificial layer 122 and the second sacrificial layer 126 may be patterned to form fin trenches, as shown in FIG. 4. In some embodiments, the forming of the fin trenches 128 may be a photolithography process. For example, a hard mask layer (not shown) is formed on the second sacrificial layer 126 and a photoresist pattern (not shown) for defining the fin trenches 128 is formed on the hard mask layer. The hard mask layer is then etched using the photoresist pattern as an etch mask, so that a hard mask pattern (not shown) is formed. Subsequently, the photoresist pattern is removed, and the bottom spacer layer 120, the top spacer layer 124, the first sacrificial layer 122 and the second sacrificial layer 126 are etched using the hard mask pattern as etch mask. The etching may be an anisotropic etching process such as reactive-ion etching (RIE) or deep reactive-ion etching (DRIE), for example, Bosch process. The hard mask pattern is then removed.

In some embodiments, a channel fin 130 and a vertical fin 140 are formed in the fin trenches, wherein the channel fin 130 is formed the bottom source/drain 114a, while the vertical fin 140 is formed on the bottom cathode/anode 114b. In various embodiments, the vertical fin 140 and the channel fin 130 may be epitaxial grown from the bottom cathode/anode 114b and the bottom source/drain 114a, respectively. In some embodiments, the vertical fin 140 and the channel fin 130 may be formed by single crystal epitaxial growth. In various embodiments, the channel fin 130 and the vertical fin 140 have the same crystal orientation as the bottom source/drain 114a and the bottom cathode/anode 114b (doped layer). In one or more embodiments, the channel fin 130 and the vertical fin 140 may be single element such as Si, Ge, or maybe compound semiconductor such as GaAs, SiGe, indium aluminum arsenide (InAlAs), indium gallium arsenide (InGaAs), indium arsenide (InAs).

In various embodiments, the portion of the first sacrificial layer 122 in the fin trenches 128 may be oxidized to form oxide layer liners (not shown). The oxide layer liners prevent the crystal structure of the first sacrificial layer 122 from interfering the epitaxial growth of the vertical fin 140 and the channel fin 130. In some embodiments, the oxide layer liners may be formed by heat oxidation or plasma oxidation performed on the portion of the first sacrificial layer 122 inside the fin trenches. In one or more embodiments, the temperature ranges from 800° C.-1200° C., and the oxidizing gas may be oxygen or steam. In such embodiments, the oxide layer liners may be silicon dioxide ($SiO_2$).

In some embodiments, the top portions of the channel fin 130 and the vertical fin 140 exposed from the fin trenches 128 may be removed. In such embodiments, etch process selective to the material of the channel fin 130 and the vertical fin 140 may be performed. In some other embodiments, RIE is used for removing. The top surfaces of the channel fin 130 and the vertical fin 140 may be below the top surface of the second sacrificial layer 126 but above the top surface of the top spacer layer 124. In some embodiments, dielectric caps 150 may be formed in the fin trenches, on top of the partly removed channel fin 130 and the vertical fin 140, as shown in FIG. 5. The formed dielectric caps 150 may be above the top surface of the second sacrificial layer 126 and a chemical mechanical polishing (CMP) process may be performed to planarize the dielectric caps 150. In some other embodiments, the dielectric caps 150 may be planarized with etching.

Subsequently, in step S15, a top source/drain 132 is formed on the channel fin 130 and a top cathode/anode 142 is formed on the vertical fin 140. Please refer to FIG. 6, in one or more embodiments, the second sacrificial layer 126 may be removed using wet etch or RIE. The top portions of the channel fin 130 and the vertical fin 140 are reduced in width by selective etching the side surface exposed by removing the second sacrificial layer 126.

Figure 6:
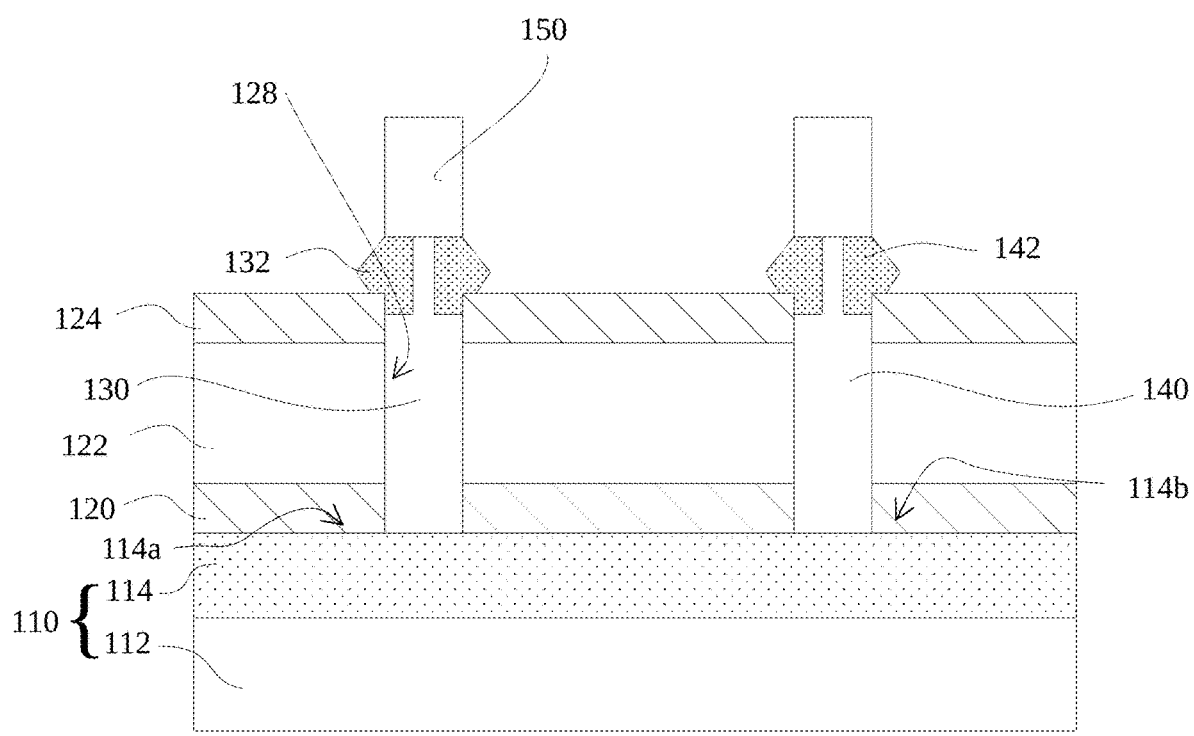

In some embodiments, a top source/drain 132 is then formed on the channel fin 130, and a top cathode/anode 142 is formed on the vertical fin 140. In various embodiments, the top source/drain 132 and the top cathode/anode 142 may be doped semiconductor material, which may be n-doped or p-doped. In one embodiment, the top source/drain 132 and the top cathode/anode 142 may epitaxially grown on the exposed surface of the width-reduced portions of the channel fin 130 and the vertical fin 140. In one or more embodiments, the top source/drain 132 and the top cathode/anode 142 may be doped in-situ during the forming of the top source/drain 132 and the top cathode/anode 142, as shown in FIG. 6.

Figure 7:
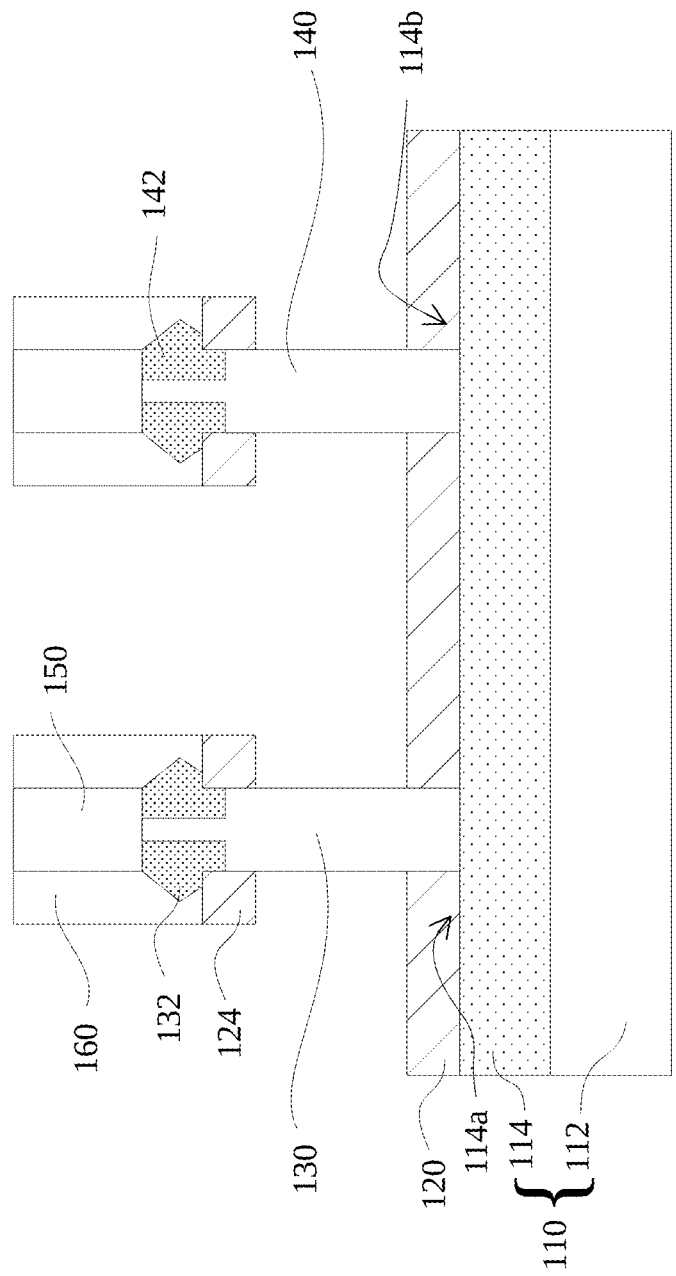

Please refer to FIG. 7, in various embodiments, a mask layer 160 may be formed on the dielectric caps 150, the top source/drain 132, the top cathode/anode 142, and the top spacer layer 124. The mask layer 160 may then be used as a mask to pattern the top spacer layer 124 and the first sacrificial layer 122. In one or more embodiments, the thickness of the mask layer 160 may be adjusted by CMP or etching. In one embodiment, the top spacer layer 124 and the first sacrificial layer 122 may be patterned by anisotropic RIE. The remaining first sacrificial layer 122 is then removed by a wet etch, as shown in FIG. 7. In various embodiments, the oxide layer liners are also removed by a wet etch or RIE to expose the channel fin 130 and the vertical fin 140.

Figure 8:
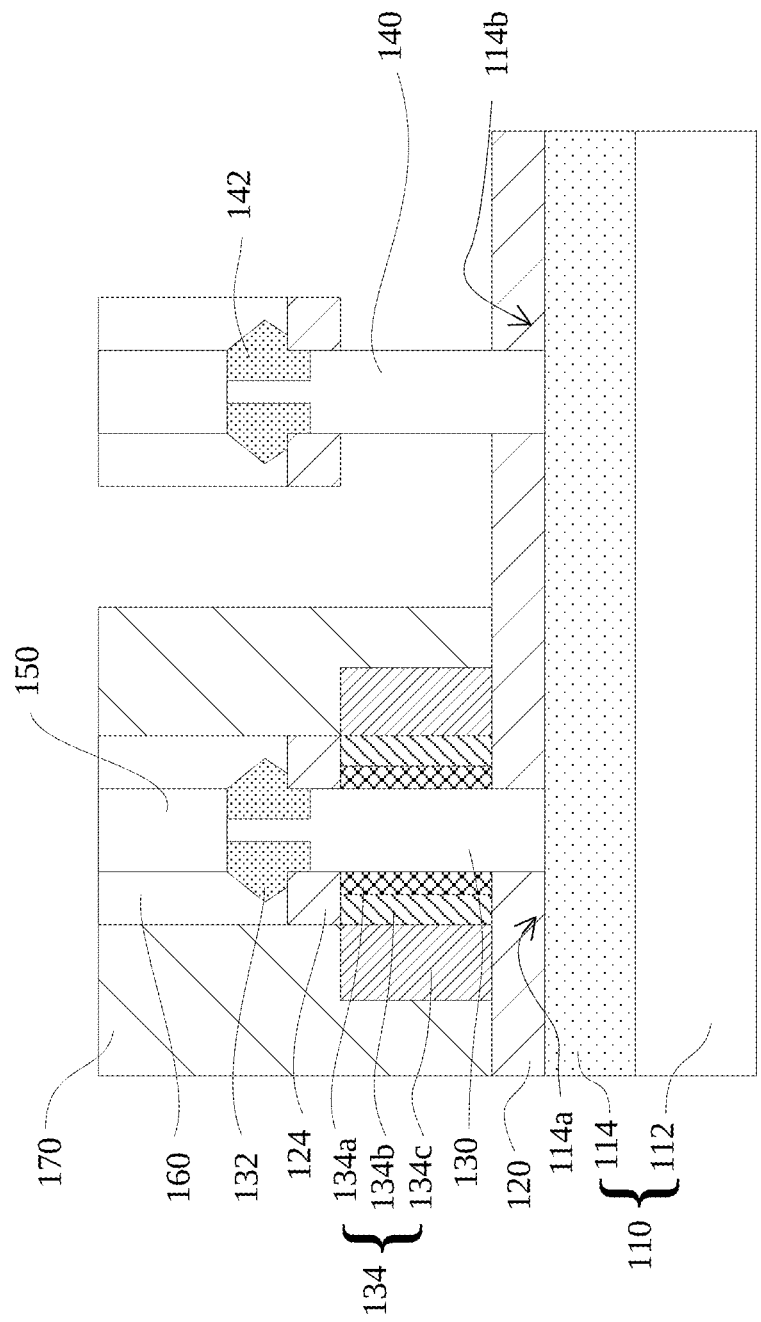
Figure 9:
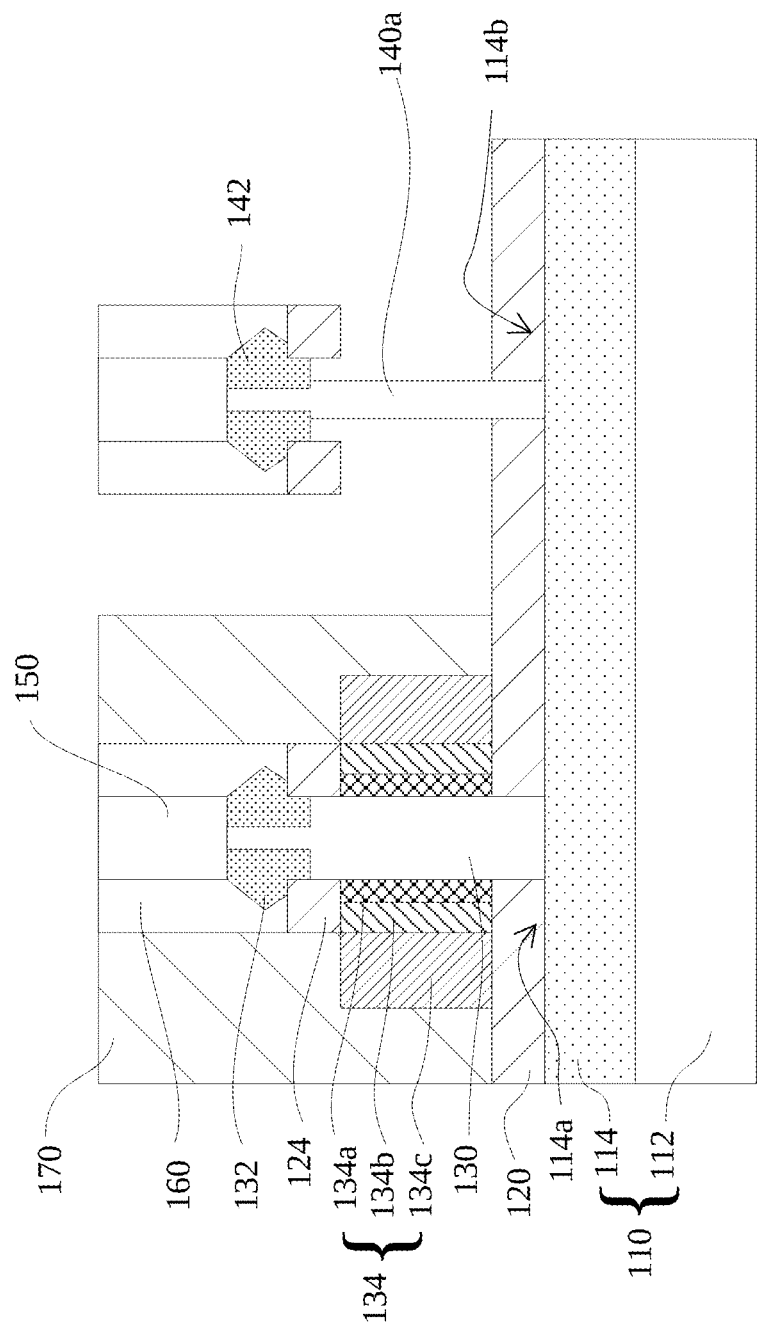
Figure 10:
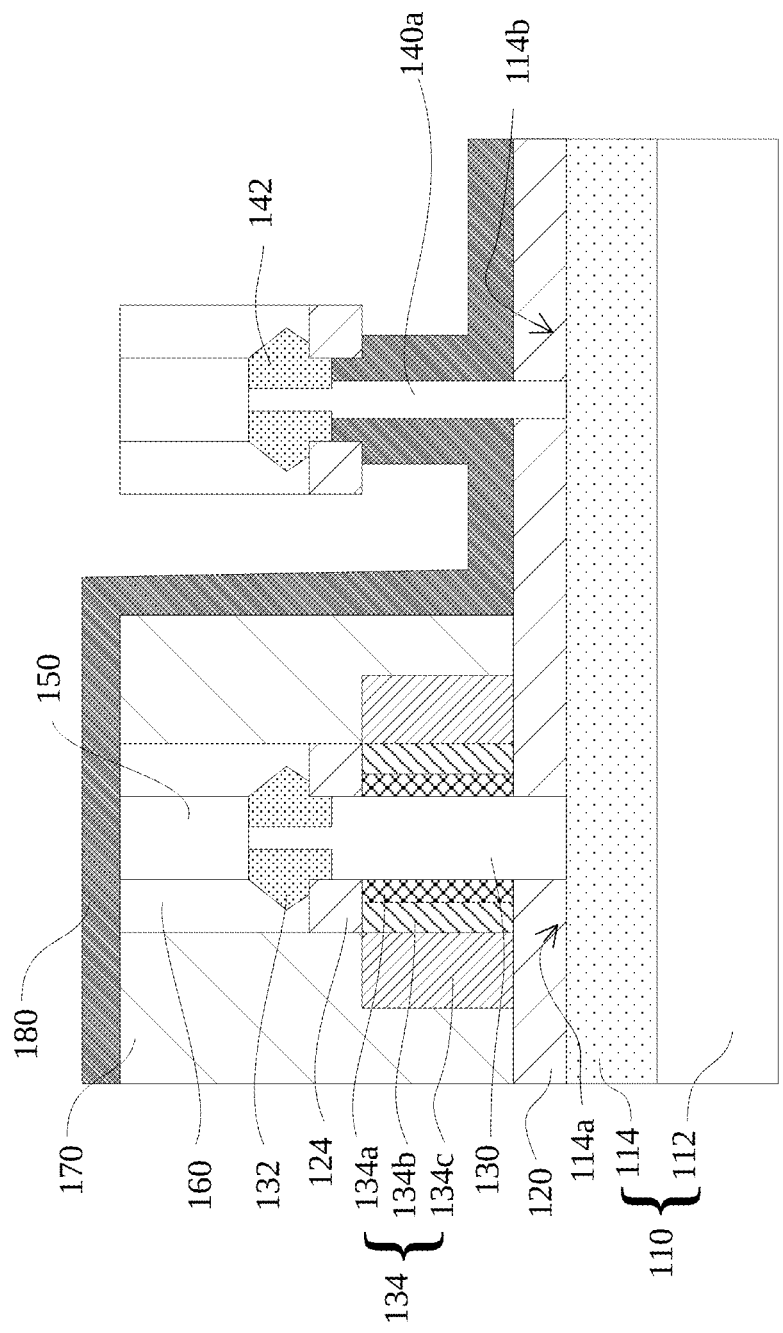

Please refer to FIG. 2, and FIG. 8. In the next step S17, a gate structure 134 is formed on the channel fin 130. In some embodiments, the formation of the gate structure 134 may further include several steps. For example, please refer to FIG. 8, First, a gate insulation 134a is formed on the channel fin 130. For example, a gate insulation 134a may be formed to cover the exposed portion of the channel fin 130. The gate insulation 134a may be formed of a high-k material, such as hafnium oxide (e.g., $HfO_2$), lanthanum oxide (e.g., $La_2O_3$), zirconium silicon oxide (e.g., $ZrSiO_4$), barium titanium oxide (e.g., $BaTiO_3$), aluminum oxide (e.g., $Al_2O_3$), and lead scandium tantalum oxide ($Pb(Sc_xTa_{1-x})O_3$). In some embodiments, the formation of the gate insulation 134a may be achieved by deposition such as atomic layer deposition (ALD) and/or CVD. A gate conductor 134b is formed on the gate insulation 134a. In some embodiments, gate conductor 134b may include a metal layer (not shown). In such case, the metal layer may, for example, include a nickel (Ni) layer, a tantalum (Ta), a titanium nitride (TiN) layer, a tantalum nitride (TaN) layer, a tungsten (W) layer, aluminum (Al), or the like by PVD or CVD. A gate electrode 134c may be formed on the gate conductor 134b. In some embodiments, the gate electrode 134c may include tungsten (W). In various embodiments, the gate insulation 134a, the gate conductor 134b, the gate electrode 134c may be formed by selective RIE. The gate structure 134, the channel fin 130, the top source/drain 132, and the bottom source/drain 114a form a transistor. In some embodiments, the space above the bottom source/drain 114a may be filled with dielectric fill 170, which may be, for example, oxide.

Please refer to FIG. 2, and FIG. 1. Subsequently, in step S19, the vertical fin 140 is oxidized to form an oxidized sidewall 140b. In various embodiments, thermal oxidation may be done using an oxidizing gas (e.g., O2, O3, etc.). The oxidation of the vertical fin 140 (e.g., a-Si) may form $SiO_2$. In some embodiments, the oxidized sidewall 140a can then be removed to reduce the width of the vertical fin 140. The vertical fin 140 is integrally formed with the transistor and has a reduced size, which saves the chip space. In some embodiments, the vertical fin 140 may be silicided to form a fuse fin.

Figure 11:
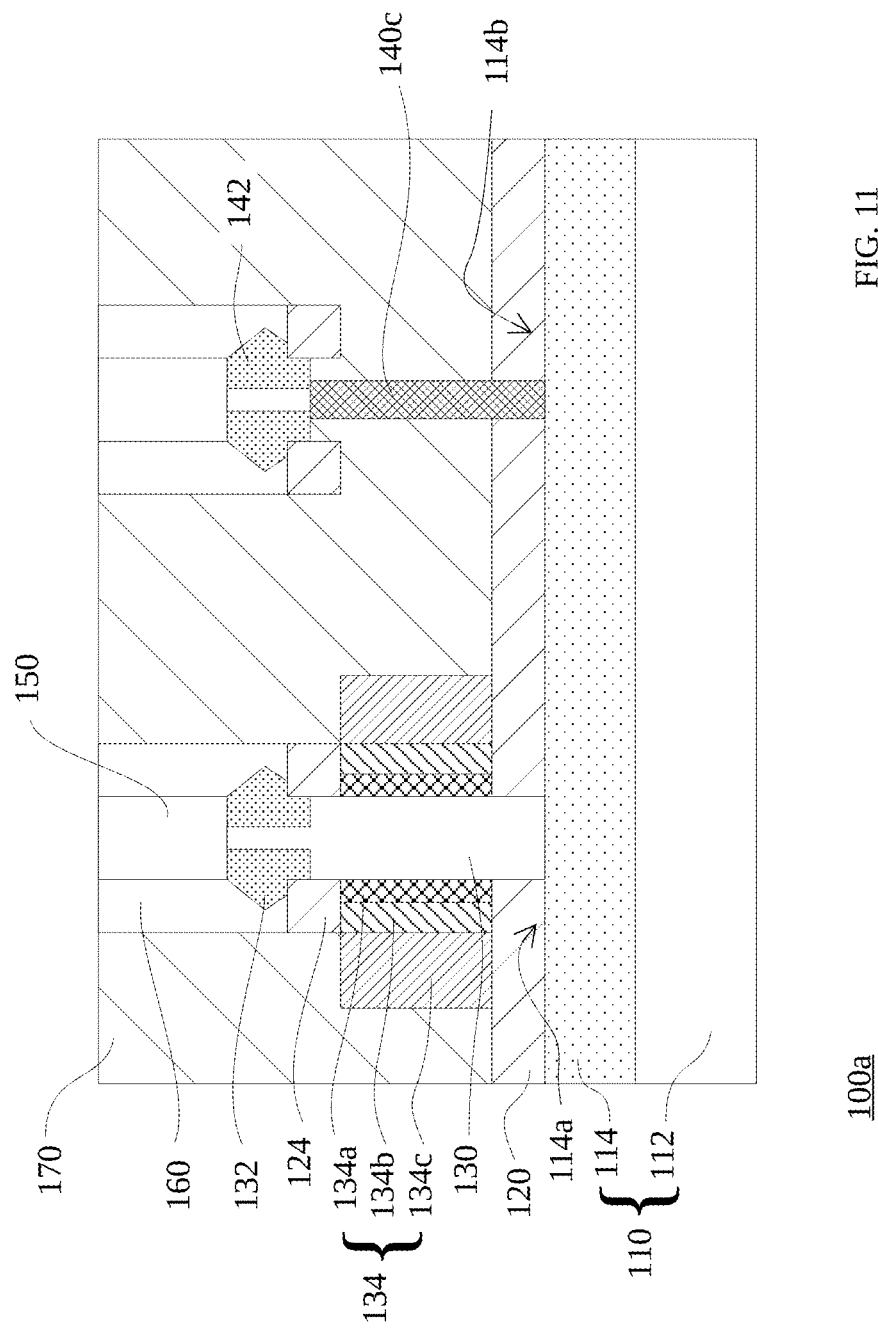
FIG. 11 is a sectional view of another semiconductor structure in accordance with some embodiments of the present disclosure.

The steps of forming the fuse fin include the following steps. Please refer to FIG. 9, the oxidized sidewall 140b of the vertical fin 140 is removed and a reduced vertical fin 140a with a width smaller than that of the channel fin 130 remains. In one or more embodiments, the oxidized sidewall 140b may be removed by a wet etch or RIE, where the wet etch or RIE may selectively remove oxide. Please refer to FIG. 10, a metal layer 180 is formed on the reduced vertical fin 140a. In some embodiments, the metal layer 180 may include platinum or nickel or other material that forms a silicide with the reduced vertical fin 140a. The metal layer 300 may be deposited by CVD, ALD or other suitable deposition processes. FIG. 11 is a sectional view of another semiconductor structure in accordance with some embodiments of the present disclosure. Please refer to FIG. 11, an anneal process is performed so the reduced vertical fin 140a may react with the metal layer 180 to form a silicided fuse fin 140c. The top cathode/anode 142, the bottom cathode/anode 114b, and the fuse fin 140c of the semiconductor structure 100a form a e-fuse integrated with the transistor. After the silicidation, the space above the bottom cathode/anode 114b can be filled with dielectric fill 170.

Figure 12:
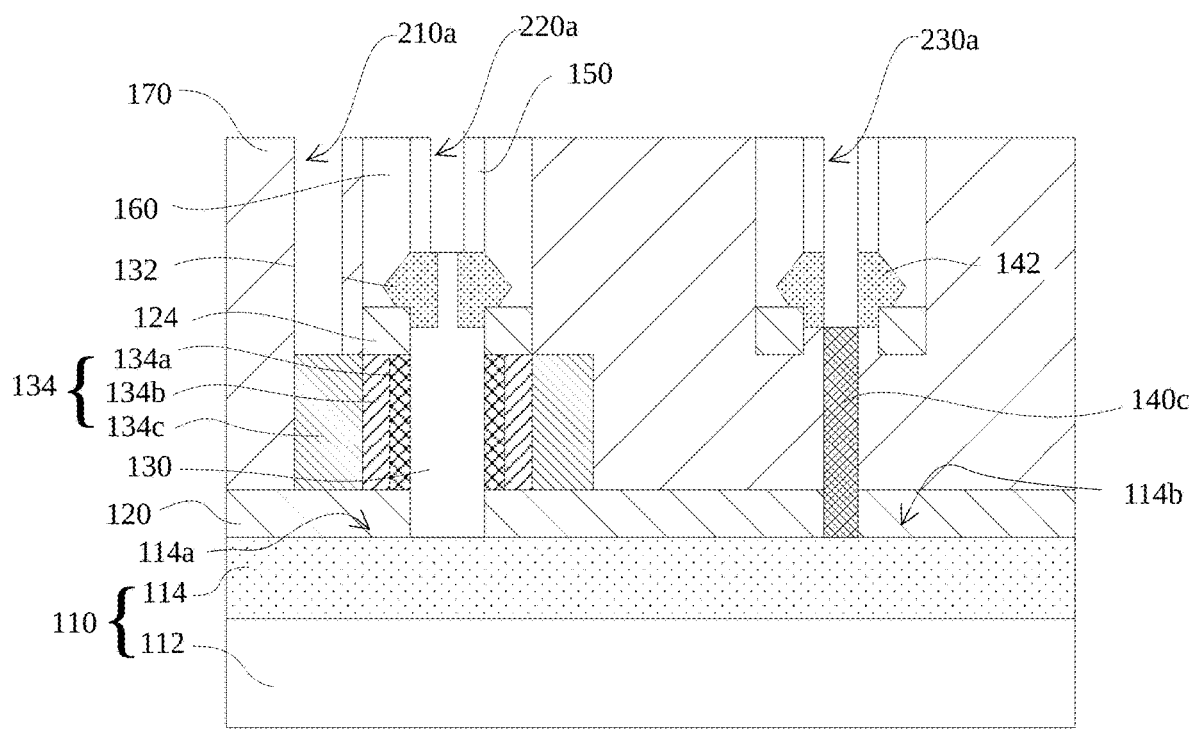
Figure 13:
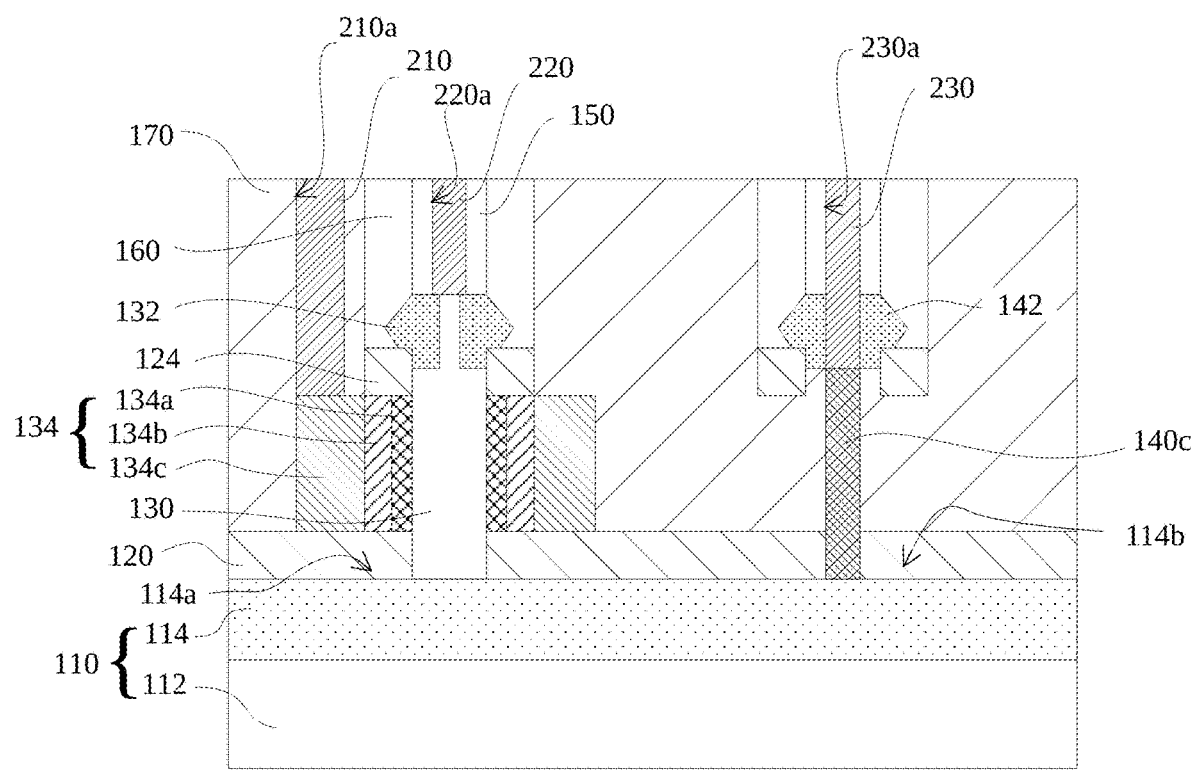
FIG. 13 is a sectional view of yet another semiconductor structure in accordance with some embodiments of the present disclosure.

In one or more embodiments, the semiconductor structure may have contacts connected to the gate structure 134, the top source/drain 132, and the top cathode/anode 142. FIG. 12 is a sectional view of the result of the steps of a method of manufacturing a semiconductor structure in accordance with some embodiments of the present disclosure, and FIG. 13 is a sectional view of yet another semiconductor structure in accordance with some embodiments of the present disclosure. Please refer to FIG. 12 and FIG. 13, semiconductor structure 100*b* further has a gate contact 210 connected to the gate structure 134, a source/drain contact 220 connected to the top source/drain 132, and a cathode/anode contact 230 connected to the top cathode/anode 142. In various embodiments, the gate contact 210, the source/drain contact 220, and the cathode/anode contact 230 may be formed by first forming contact trenches. In one or more embodiments, the gate contact trench 210*a* is formed in the dielectric fill 170, exposing the gate electrode 134*c*. The source/drain contact trench 220*a* is formed in the dielectric caps 150 on the top source/drain 132, exposing the top source/drain 132. The cathode/anode contact trench 230*a* is formed in the dielectric caps 150 on the top cathode/anode 142, exposing the top cathode/anode 142. In various embodiments, the gate contact trench 210*a*, the source/drain contact trench 220*a*, and the cathode/anode contact trench 230*a* may be formed by anisotropic RIE. The gate contact 210, the source/drain contact 220, and the cathode/anode contact 230 are then formed in the gate contact trench 210*a*, the source/drain contact trench 220*a*, and the cathode/anode contact trench 230*a*, respectively. In one embodiment, the gate contact 210 may be the same material of the gate electrode 134*c*.

Figure 14:
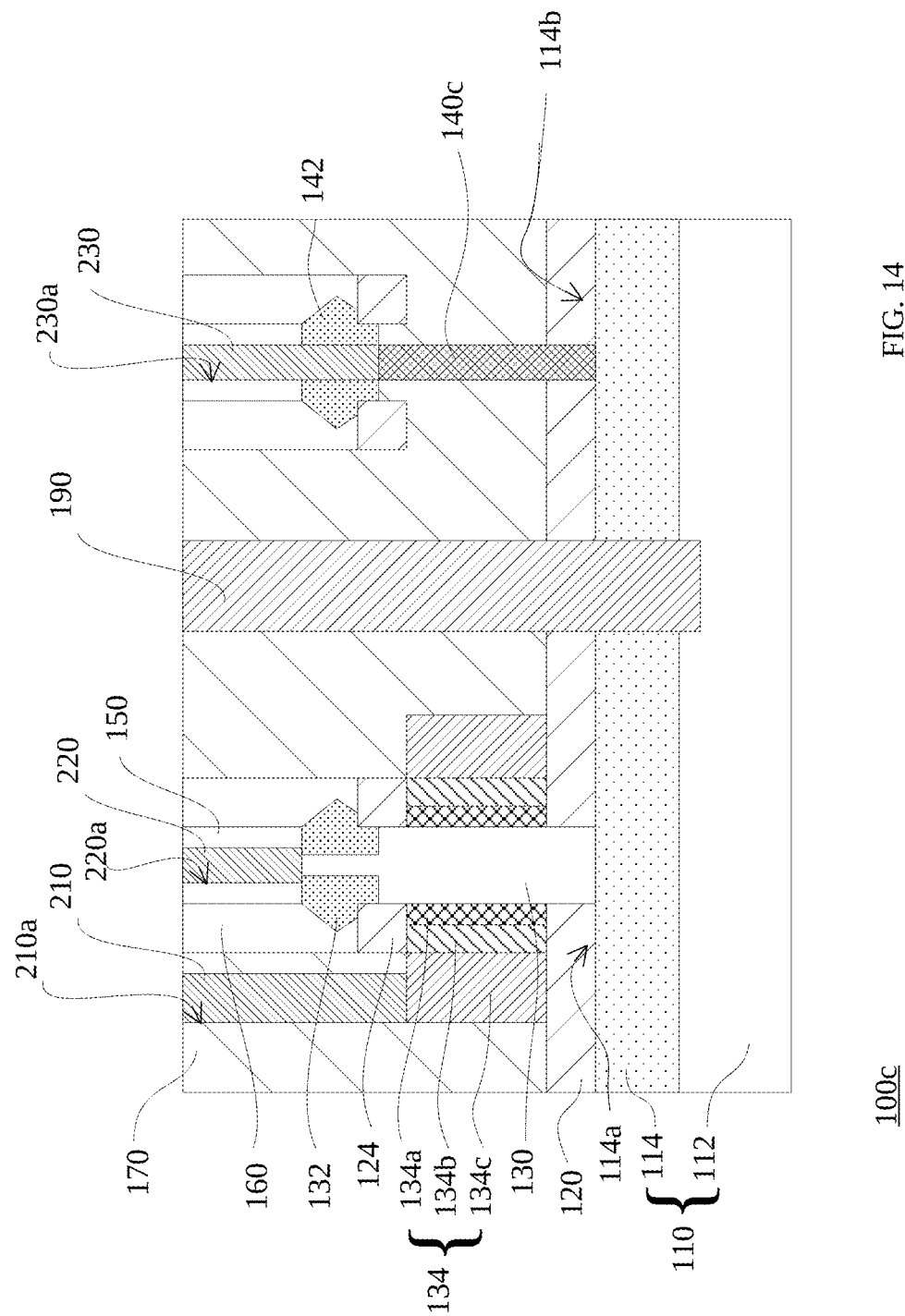
FIG. 14 is a sectional view of yet another semiconductor structure in accordance with some embodiments of the present disclosure.

FIG. 14 is a sectional view of yet another semiconductor structure in accordance with some embodiments of the present disclosure. Please refer to FIG. 14, semiconductor structure 100*c* further has a shallow trench isolation (STI) 190 between the bottom source/drain 114*a* and the bottom cathode/anode 114*b*. An STI trench (not shown) may be formed on the dielectric fill 170 and the substrate 110 and filled to form the shallow trench isolation 190. In some embodiments, the STI trenches may be formed by selective etching. Next, to form the shallow trench isolation 190, the step of forming an insulating layer over dielectric fill 170 and the STI trenches may be performed. In some embodiments, the insulation layer may be formed by a single gap-filling process based on a fluid oxide layer. In some other embodiments, the insulation layer may be configured in the form of a combination (e.g., a stacked form) of the fluid oxide layer and the deposition oxide layer. For example, the fluid oxide layer may include a spin-on dielectric (SOD) and the deposition oxide layer may include a high-density plasma (HDP) oxide layer. The insulation layer is then polished by CMP to remove the insulation layer on the dielectric fill 170. The insulation layer remaining in the STI trenches forms the shallow trench isolation 190 as shown in FIG. 14.

The semiconductor structures disclosed in the present disclosure have a vertical fin 140 simultaneously formed with the channel fin 130, which simplifies the manufacturing process. The vertical fin 140 then be oxidized to reduce the width in order to save valuable chip space. The vertical fin 140 can be silicided to form a fuse 140*c*, which forms a e-fuse along with top cathode/anode 142 and bottom cathode/anode 114*b*. The e-fuse manufactured with the manufacturing method disclosed in the present disclosure thus has the advantage of simpler process and smaller footprint. Therefore, the present disclosure can facilitate the production of chips with lower cost and more functions.

In one embodiment, the present disclosure provides a semiconductor structure. The semiconductor structure include a substrate, a top source/drain, a channel fin, a gate structure, a top cathode/anode, and a vertical fin. The substrate has a bottom source/drain and a bottom cathode/anode. The top source/drain is disposed above the bottom source/drain of the substrate, and the channel fin connects the top source/drain to the bottom source/drain of the substrate. The gate structure is disposed on the channel fin. The top cathode/anode is disposed above the bottom cathode/anode of the substrate, and the vertical fin connects the top cathode/anode to the bottom cathode/anode of the substrate, wherein the vertical fin has an oxidized sidewall.

In one embodiment, the present disclosure provides another semiconductor structure. The semiconductor structure includes a substrate, a top source/drain, a channel fin, a gate structure, a top cathode/anode, and a fuse fin. The substrate has a bottom source/drain and a bottom cathode/anode. The top source/drain is disposed above the bottom source/drain of the substrate, and the channel fin connects the top source/drain to the bottom source/drain of the substrate. The gate structure is disposed on the channel fin. The top cathode/anode is disposed above the bottom cathode/anode of the substrate, and the fuse fin connects the top cathode/anode to the bottom cathode/anode of the substrate, wherein the width of the fuse fin is smaller than the width of the channel fin.

In another embodiment, the present disclosure provides a method of manufacturing a semiconductor structure. The method of manufacturing the semiconductor structure begins with the step of providing a substrate. The substrate has a bottom source/drain and a bottom cathode/anode. Next, a channel fin is formed on the bottom source/drain of the substrate, and a vertical fin is formed on the cathode/anode of the substrate. The flowing step is forming a top source/drain on the channel fin and a top cathode/anode on the vertical fin. In the next step, a gate structure is formed on the channel fin. Finally, an oxidized sidewall is formed on the vertical fin.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:
1. A semiconductor structure, comprising:
 a substrate, having a bottom source/drain and a bottom cathode/anode;
 a top spacer layer deposited above the bottom source/drain and the bottom cathode/anode;
 a top source/drain above the bottom source/drain of the substrate;

a channel fin, connecting an upper surface of the top source/drain to the bottom source/drain of the substrate;
a gate structure, disposed on the channel fin;
a top cathode/anode above the bottom cathode/anode of the substrate and in direct contact with the top spacer layer; and
a vertical fin, connecting the top cathode/anode to the bottom cathode/anode of the substrate, wherein the vertical fin separates from the top spacer layer.

2. The semiconductor structure of claim 1, further comprising a shallow trench isolation disposed between the bottom source/drain and the bottom cathode/anode.

3. The semiconductor structure of claim 1, wherein the gate structure comprises a gate insulation, a gate conductor, and a gate electrode.

4. The semiconductor structure of claim 3, further comprising a gate contact, wherein the gate contact is connected to the gate electrode.

5. The semiconductor structure of claim 1, wherein the gate structure surrounds the channel fin.

6. The semiconductor structure of claim 1, further comprising a source/drain contact, wherein the source/drain contact is connected to the top source/drain.

7. A semiconductor structure, comprising:
a substrate having a bottom source/drain and a bottom cathode/anode of the substrate;
a top spacer layer deposited above the bottom source/drain and the bottom cathode/anode;
a top source/drain above the bottom source/drain;
a channel fin, connecting an upper surface of the top source/drain to the bottom source/drain of the substrate;
a gate structure, disposed on the channel fin;
a top cathode/anode above the bottom cathode/anode of the substrate and in direct contact with the top spacer layer; and
a fuse fin, connecting the top cathode/anode to the bottom cathode/anode of the substrate, wherein a width of the fuse fin is smaller than a width of the channel fin, wherein the fuse fin separates from the top spacer layer.

8. The semiconductor structure of claim 7, further comprising a shallow trench isolation disposed between the bottom source/drain and the bottom cathode/anode.

9. The semiconductor structure of claim 7, wherein the gate structure comprises a gate insulation and a gate electrode.

10. The semiconductor structure of claim 9, further comprising a gate contact, wherein the gate contact is connected to the gate electrode.

11. The semiconductor structure of claim 7, wherein the gate structure surrounds the channel fin.

12. The semiconductor structure of claim 7, further comprising a source/drain contact, wherein the source/drain contact is connected to the top source/drain.

* * * * *